United States Patent [19]

Axell

[11] Patent Number: 4,672,341

[45] Date of Patent: Jun. 9, 1987

[54] SAMPLING CIRCUIT FOR MICROWAVE SIGNALS

[75] Inventor: Claes E. S. Axell, Askim, Sweden

[73] Assignee: Telefonaktiebolaget LM Ericsson, Stockholm, Sweden

[21] Appl. No.: 787,979

[22] Filed: Oct. 16, 1985

[30] Foreign Application Priority Data

Nov. 1, 1984 [SE] Sweden .............................. 8405487

[51] Int. Cl.$^4$ ...................... H01P 1/15; H01P 3/08
[52] U.S. Cl. .................................. 333/247; 333/238; 333/262
[58] Field of Search ............... 333/161, 164, 238, 246, 333/247, 262; 307/320, 321, 352, 353; 331/9, 26, 28, 96, 101, 102; 329/160, 164, 203, 204

[56] References Cited

U.S. PATENT DOCUMENTS 4,275,367 6/1981 Gaglione et al. .................... 333/164
4,276,655 6/1981 Kraemer et al. ................. 333/238 X Primary Examiner—Marvin L. Nussbaum
Attorney, Agent, or Firm—Roberts, Spiecens & Cohen

[57] ABSTRACT

A sampling circuit for microwave signals includes a substrate (S), a planar microwave guide (PL) on one side of the substrate and a conductive surface on the other. A slotline is formed by a rectangular insulating area (B) on the other side, and a drive pulse conductor (KX) is connected to opposite edges of the insulating area for supplying the sampling pulses. On one side of the substrate there are two separate conductive surfaces (A1,A2), which together with the conductive surface (A) on the other side forms the capacitors included in the sampling circuit. Two discrete diodes (D1,D2) are connected between the microwave guide and the respective surface (A1,A2), and resistors (R1,R2) are connected between these surfaces and planar output waveguides (UL1,UL2) for the sampling circuit.

4 Claims, 4 Drawing Figures

SAMPLING CIRCUIT FOR MICROWAVE SIGNALS

TECHNICAL FIELD

The present invention relates to a sampling circuit for microwave signals, more specifically for signals from a controlled oscillator, e.g. a voltage-controlled oscillator (VCO), for locking it to the signals from a stable signal source.

BACKGROUND ART

To obtain the best signal-to-noise performance from a wideband VCO generating a microwave signal, it is necessary to lock this signal to a stable source, e.g. a crystal oscillator.

By sampling the output signal from the VCO there is obtained the phase angle of the output signal, which is then fed back so that a constant phase, and thereby a stable signal, is obtained. The technique is generally known and provides certain advantages for the complete microwave generator, e.g. small volume and the facility of generating several frequencies that are multiples of the signal source frequency. A sampling circuit, specially implemented for signals within the microwave range, is used to sample the microwave signal from VCO, and this circuit is the one envisaged by the invention.

A sampling circuit in the prior art for this purpose is described in the IEEE Journal of Solid State Circuits, Vol SC-7, No. 1, February 1972. Typical for this circuit is that it has a complicated mechanical construction, with through plating in the substrate and a plurality of chip components. This known circuit is of the thin film type with bonded-in diodes and capacitors.

DISCLOSURE OF INVENTION

The principle of a sampling circuit of the type intended described for microwave signals is that of obtaining an accurately determined sampling of the microwave signal. A coaxial conductor leads a drive pulse to diode switches which are connected to a microwave guide carrying the microwave signal. Discrete components are used in the known circuit as switches, as well as discrete capacitors for obtaining the desired sampling. The essential role is emphasised here that is played by diodes, capacitances and resistors for determining circuit properties and obtaining specific sampling of the microwave signal. This gives rise to problems stemming from the fact that the components used have large physical size or extension in relation to the small physical distances between their terminals. The most serious disadvantages is in manufacturing and tuning a sampling circuit of the known implementation. It has been proposed, as a development step for solving the above-mentioned problems to a certain extent, to place discrete capacitances in the form of capacitor components in holes bored in the substrate and at the connection points of the inner and outer conductor of the coaxial cable (drive pulse feed). This gives more room for connections, and in particular better conditions for connecting the coaxial cable to the associated slotline. This solution has been found difficult to manufacture, however.

An object of the present invention is thus to provide a sampling circuit for microwave signals, in which circuit parameters such as capacitance are integrated into the circuit pattern to afford correct matching with respect to bandwidth and standing wave ratio.

The invention is characterized by the accompanying claims.

BRIEF DESCRIPTION OF DRAWINGS

The invention will now be described in detail with reference to the accompanying drawings, where.

BEST MODES FOR CARRYING OUT THE INVENTION

Figure 1:
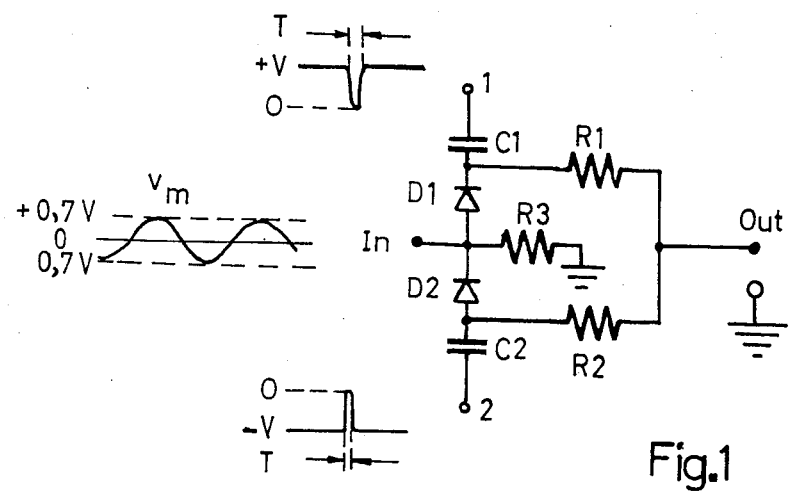
FIG. 1 is a wiring diagram of a sampling circuit for microwave signals.

In FIG. 1 there is a wiring diagram of a sampling circuit for illustrating the principle, known per se, of sampling microwave signals. A microwave signal $v_m$ occurs at the circuit input terminal $I_n$. This terminal is connected to two diodes D1 and D2, constituting the circuit switches. Two capacitors C1 and C2 are connected to the respective diode D1, D2 and to the terminals 1 and 2 of an unillustrated drive pulse generator. Two resistors R1, R2 are connected to the connection points between the respective diode D1, D2 and capacitor C1, C2. The sampled microwave signal is obtained at the output $O_{ut}$.

When a pulse from the drive pulse generator occurs at the terminals 1 and 2 the diodes will switch from the nonconducting to the conducting state. The phase angle, represented by the instantaneous voltage, which the signal $v_m$ from the microwave source has at the terminal $I_n$ will be transferred to the capacitors C1 and C2 at the sampling instant, with $\pm 0.7$ volt difference, according to FIG. 1. At the terminal $O_{ut}$ the base voltage of the diodes is balanced out by the resistors R1 and R2, and the phase angle prevailing at the sampling instant is sensed.

Figure 2:
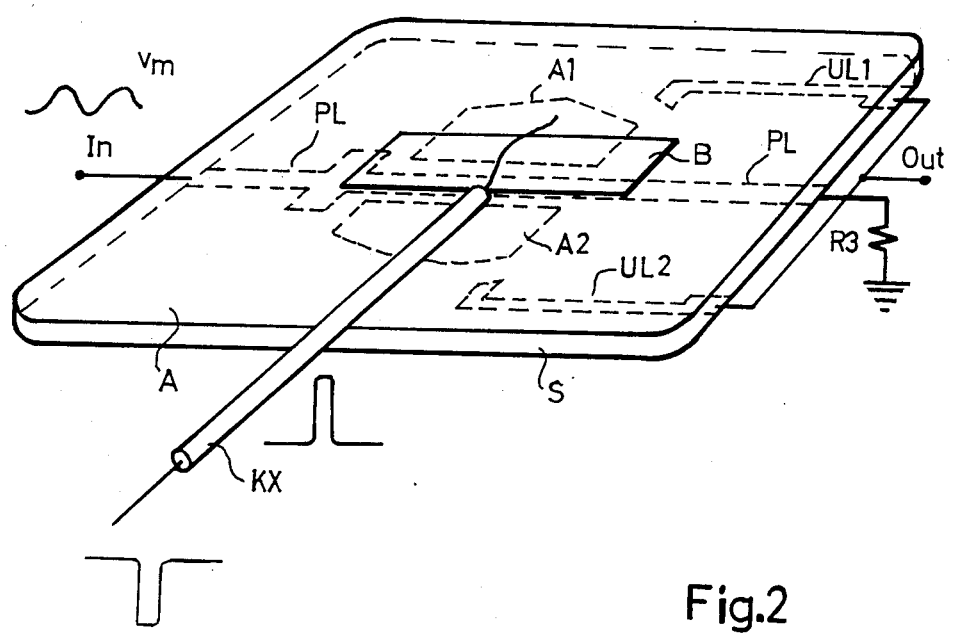
FIG. 2 is a schematic, perspective, "X-ray" view of an inventive sampling circuit.

FIG. 2 is a schematic X-ray view of an implementation of the sampling circuit according to the invention. A layer A of copper or other conductive material is applied to a substrate S of insulating material. The surface B is an insulating area at the centre of the substrate surface, and is suitably formed by an etching technique. Together with the (conductive) layer or surface A the surface B forms a so-called slotline, of a wave conductor with conductive walls corresponding to the surfaces A, enclosing an inner space in which field propagation takes place.

Figure 4:
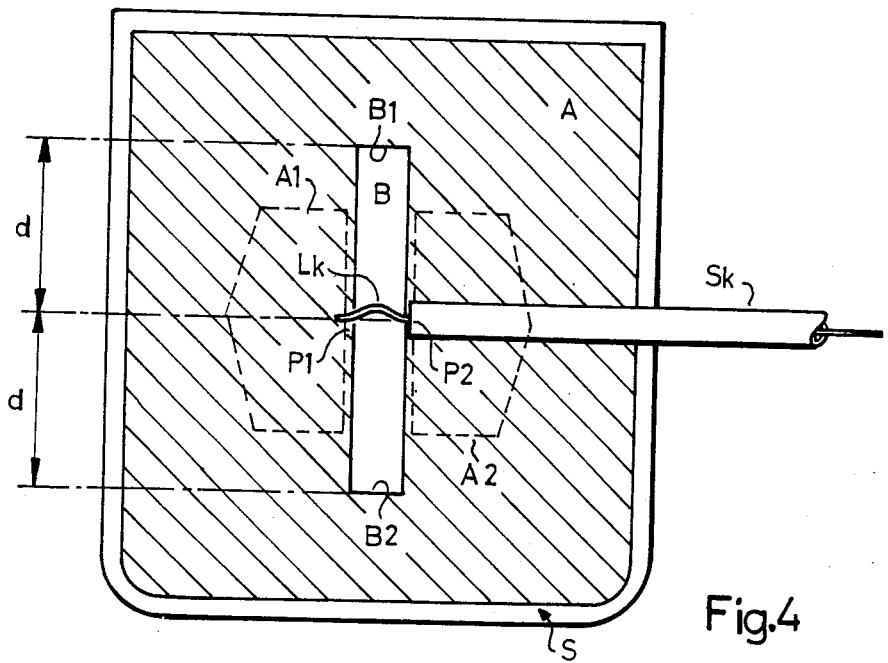
FIG. 4 illustrates the same circuit seen from the underside (from above according to FIG. 2).

A coaxial cable KX is adapted as drive pulse conductor. The centre conductor of the cable has its end point fixed (soldered) to the copper surface A at the edge P1 of the slotline B, to conduct the drive pulse. The screen of the cable is fixed in corresponding way to the copper surface A at the point P2, at the opposite edge of the slotline B. In FIG. 4 it is shown more closely how the coaxial cable connection is arranged at the points P1 and P2 for the screen $S_k$ and central conductor $L_k$. As will be seen from FIG. 4 the slotline B in the embodiment illustrated here is of rectangular configuration and situated so that its line of symmetry coincides with the centre line of the planar conductor PL on the other side of the circuit board, i.e. the substrate S.

Figure 3:
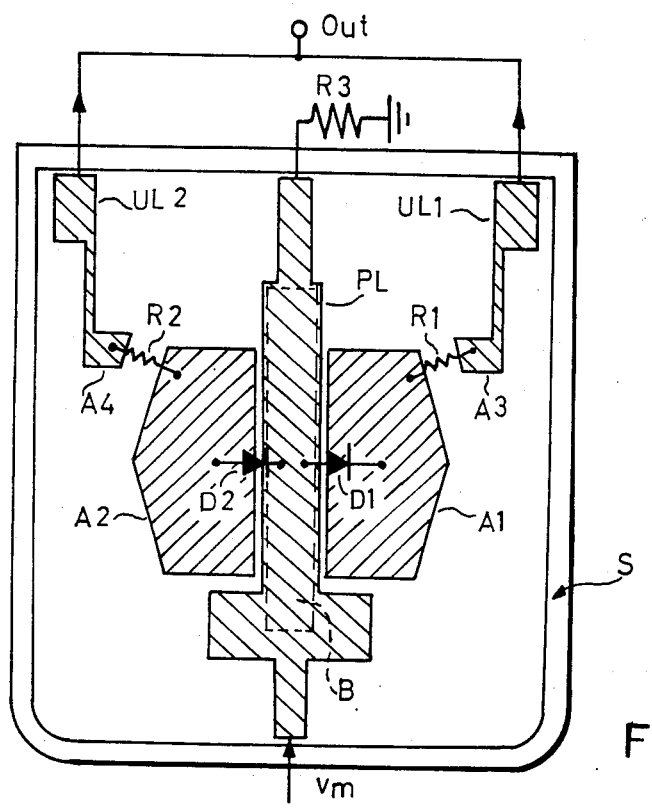
FIG. 3 illustrates the circuit of FIG. 2 seen from the upper side (from below according to FIG. 2)

The implementation of the other side of the substrate indicated in FIG. 2 is best seen in FIG. 3. An essentially narrow planar conductor PL extends from one to the other edge of the substrate S and runs (partially) parallel to the slotline B (denoted by dashed lines in FIG. 3). Two copper conductive surfaces A1 and A2 are situated level with, and on either side of, of both the conductor PL and the slotline B. In accordance with the invention, the surfaces A1 and A2 on the upper side, together with the copper-coated surface A on the underside have been arranged such as to form the capacitors C1 and C2 in FIG. 1. The conductor PL thus constitutes the feed conductor for the microwave signal $v_m$, which is fed to the conductor PL at one substrate edge in a suitable way. The capacitor C1 is thus formed by the conductive surface A1, the underlying conductive surface A and the intermediate, insulating substrate S. In a similar manner, the capacitor C2 is formed by the conductive surface A2, surface A and substrate S. The diodes D1 and D2 are connected as discrete components (microwave diodes) between the respective surfaces A1 and A2 and the wave guide PL.

The drive pulse, generated as described above by the drive pulse generator, is taken to the points P1 and P2 corresponding to the terminals 1 and 2 in FIG. 1 via the coaxial cable KX. By extinguishing (see below), an exactly timed pulse (potential difference) is obtained across the points P1 and P2, which are on the symmetry line of the coaxial cable. The edges B1 and B2 on the slotline B constitute shortcircuits for the fed-in pulse, where it is reflected and phase-reversed such that after the delay time T defined by the distance 2d it extinguishes any remaining drive pulse over the points P1 and P2. The length 2d of the slotline B thus gives a time T, according to the diagram in FIG. 1.

The output conductors are formed on the substrate S as two surfaces UL1 and UL2, which are joined to the surfaces A1 and A2 via the surfaces A3, A4 and the resistors R1 and R2. The conductor PL at the edge of the substrate S is terminated by a resistor R3 to obtain a suitable resistive termination of the microwave guide.

In the embodiment according to FIGS. 3 and 4, the capacitors C1 and C2 have thus been formed as geographically spread-out components and, in contradistinction to already known embodiments, they have been moved over to the microwave guide side, where they have been integrated by etching into the planar wave guide pattern. The diode switches D1 and D2 will thus be very simple to connect, and no through plating of the substrate is necessary. The conductor pattern illustrated in FIGS. 3 and 4 for the capacitors C1, C2 the conductor P1 and the output wave guides UL1, UL2 are comparatively complexly constructed and are decisive for the values of the circuit parameters according to FIG. 1. The values of the capacitors C1 and C2 are calculated according to known methods of calculating plate capacitors. What is fundamental for the invention is that the capacitors which were previously discrete, are now integrated into the printed conductor pattern.

The sampling circuit may be manufactured on a soft copper-coated telfon based high-epsilon substrate where the pattern is etched. The drive pulse duration time is determined by the length of the slotline B (about 100 ps in the circuit according to FIGS. 3 and 4) and the size of the capacitors is 2.5 pF for the embodiment illustrated in FIG. 3. The terminating resistor R3 is about 50 ohms in this case.

I claim:

1. Sampling circuit for microwave signals ($v_m$) including a substrate (S) with an upper and a lower surface, a planar microwave guide PL on said substrate for guiding the microwave that is to be sampled, a drive pulse conductor (KX) with an inner and an outher conductor for conducting a pulse-shaped signal in the HF range to a pair of diodes (D1,D2) arranged as switches via capacitive elements (C1,C2) and output wave guides (UL1,UL2) from the capacitive elements, characterized by a first conductive surface (A), which substantially covers the underside of the substrate, apart from a slotline (B), the inner and outer conductors of the drive pulse conductor being connected to the first conductive surface (A) on either side of the slotline (B), a conductor (PL) extending over the upper surface of the substrate in a way such that a part runs parallel to said slotline (B) to form said microwave guide, second and third conductive surfaces (A1,A2) on the upper side of the substrate and situated on either side of said conductor (PL), for forming together with the conductive surface (A) on the underside of the substrate said capacitive element, said diodes (D1,D2) being connected between the conductor (PL) and the second and third surfaces (A1 and A2) respectively, as well as planar conductive surfaces (A3,A4) on the upper side of the substrate, which are resistively connected to the second and third surfaces (a1,A2) to form the output wave guides.

2. Sampling circuit as claimed in claim 1, characterized in that the first conductive surface (A) is provided with an insulating area (B) at the centre of the substrate surface, said area together with the first conductive surface (A) forming said slotline, the conductor (PL) extending parallel to said insulating area.

3. Sampling circuit as claimed in claim 2, characterized in that said insulating area (B) has a rectangular shape, each edge of said second and third surfaces (A1 and A2) extending substantially parallel to the long side edges of the rectangular insulating area (B).

4. A sampling circuit for microwave signals comprising a planar substrate of insulative material, a layer of conductive material on a first surface of said planar substrate, said layer having a void in the form of an elongated rectangle, a first region of conductive material on a second side of said planar substrate, said first region being in the form of a strip to provide a planar microwave guide, the void of said layer on said first surface and said first region on said second surface being positioned with respect to each other to provide a microwave slot line, means for applying a microwave signal to be sampled to one end of said first region, means for terminating the other end of said first region, means for applying control pulses to two points on said layer, said points being at opposite edges of said layer defined by the void, second and third similar regions of conductive material on said second side of said planar substrate, said second and third similar regions being spaced from and symmetrically disposed about said first region, said second and third regions cooperating with said layer to provide first and second capacitances, first and second diode means connecting said first region to said second and third regions respectively, and output means connected to said second and third regions for transmitting sampled microwave signals.

* * * * *